(12) United States Patent
Peto

(10) Patent No.: US 10,475,620 B2
(45) Date of Patent: Nov. 12, 2019

(54) CHARGED PARTICLE INSTRUMENTS

(71) Applicant: NANOSCOPE SERVICES LIMITED, Bristol (GB)

(72) Inventor: Lloyd Peto, Bristol (GB)

(73) Assignee: NANOSCOPE SERVICES LIMITED, Bristol (GB)

( * ) Notice: Subject to any disclaimer, the term of this patent is extended or adjusted under 35 U.S.C. 154(b) by 0 days.

(21) Appl. No.: 15/546,978

(22) PCT Filed: Jan. 27, 2015

(86) PCT No.: PCT/GB2015/050173
§ 371 (c)(1),
(2) Date: Jul. 27, 2017

(87) PCT Pub. No.: WO2016/120579
PCT Pub. Date: Aug. 4, 2016

(65) Prior Publication Data
US 2018/0019095 A1 Jan. 18, 2018

(51) Int. Cl.
H01J 37/08 (2006.01)
H01J 37/30 (2006.01)
(52) U.S. Cl.
CPC .......... *H01J 37/08* (2013.01); *H01J 37/3002* (2013.01); *H01J 2237/006* (2013.01); *H01J 2237/20* (2013.01); *H01J 2237/206* (2013.01); *H01J 2237/208* (2013.01); *H01J 2237/31745* (2013.01)
(58) Field of Classification Search
CPC .. H01J 37/00; H01J 37/02; H01J 37/20; H01J 37/26; H01J 37/261; H01J 37/30; H01J 37/3002

USPC ... 250/423 R, 306, 307, 311, 440.11, 442.11
See application file for complete search history.

(56) References Cited

U.S. PATENT DOCUMENTS

| 6,414,307 B1 * | 7/2002 | Gerlach ............... G01N 23/225 250/307 |
| 2005/0091815 A1 | 5/2005 | Munekane |
| 2013/0068611 A1 | 3/2013 | Botman et al. |
| 2014/0291543 A1 * | 10/2014 | Sato .................... H01J 37/3171 250/423 R |

FOREIGN PATENT DOCUMENTS

| EP | 1801586 A1 | 6/2007 |
| JP | 2006227108 A | 8/2006 |

OTHER PUBLICATIONS

Kim, P. et al., "Nanotube nanotweezer," Science, vol. 286, No. 5447, Dec. 10, 1999, pp. 2148-2150, XP002189211, ISSN: 0036-8075, DOI: 10.1126/SCIENCE.286.5447.2148.

(Continued)

*Primary Examiner* — Jason L McCormack
(74) *Attorney, Agent, or Firm* — Mossman, Kumar & Tyler PC

(57) ABSTRACT

An apparatus is disclosed for use in a charged particle instrument which defines an inner volume therein. The apparatus comprises an adaptor (22) having a first portion adapted for attachment to a part (20) of a gas injection system (18) of a charged particle instrument which is located within an inner volume of such an instrument; and a second portion arranged to receive a tool (24) adapted for interaction with a sample (14) located in the inner volume of such an instrument.

9 Claims, 4 Drawing Sheets

(56) References Cited

OTHER PUBLICATIONS

Xidex, "Parallel Gas Injection System (PGIS) for Use with the NanoBot Nanomanipulator," Jan. 1, 2011, DP055206074.
EP Application No. 15701578.5 Search Report dated Apr. 23, 2019.

* cited by examiner

CHARGED PARTICLE INSTRUMENTS

The present invention relates to charged particle instruments, and, in particular, to charged particle microscope instruments.

BACKGROUND OF THE INVENTION

Charged particle microscope instruments, such as a scanning electron beam microscope instrument, a transmission electron beam microscope instrument, a focussed ion beam (FIB) instrument, or a combination instrument using a combination of such technologies, are used to observe samples of materials, for example semiconductor materials. Such instruments are well-known and have been adapted to enable manipulation of samples under observation. For example, see U.S. Pat. No. 6,570,170 which describes the manipulation and observation of a sample in a charged particle instrument.

Manipulation of the sample if achieved by the provision of a high accuracy tool actuator at least part of which is fitted inside the instrument, and controllable to manoeuvre a manipulation tool with respect to a sample. Such actuators are complex and hence expensive.

Accordingly, it is desirable to provide an apparatus that allows samples to be manipulated within a charged particle instrument, with lower complexity and cost compared to existing solutions.

SUMMARY OF THE INVENTION

According to a first aspect of the present invention, there is provided an apparatus for use in a charged particle instrument which defines an inner volume therein, the apparatus comprising an adaptor having a first portion adapted for attachment to a part of a gas injection system of a charged particle instrument which part is located within an inner volume of such an instrument; and a second portion arranged to receive a tool adapted for interaction with a sample located in the inner volume of such an instrument.

According to another aspect of the present invention, there is provided a sample interaction apparatus for a charged particle instrument which defines an inner volume therein, the apparatus comprising an adaptor for attachment to a part of a gas injection system of a charged particle instrument which part is located within an inner volume of such an instrument, and a tool attached to the adaptor, the tool being adapted for interaction with a sample located in the inner volume of such an instrument.

According to another aspect of the present invention, there is provided a charged particle instrument comprising a housing defining an inner volume therein, a particle source operable to introduce charged particles into the observation zone, a particle detector operable to detect particles in the inner volume, a sample holder located within the inner volume and adapted to hold a sample, a gas injection system which extends into the inner volume, and which is operable to introduce a selected gas into the inner volume, and an apparatus according to another aspect of the present invention, wherein the sample stage is operable to move a sample located thereon with respect to the tool.

In one example, the adaptor is adapted to be releasably attached to said part of the gas injection system. In one example, the tool is adapted to be releasably attached to the adaptor.

In one example, the tool is a manipulation needle. Such a needle may be of a resilient, conductive, non-metallic material, such as a carbon fibre.

An embodiment of the present invention provides an adaptor that enables a tool to be mounted on an existing part of a charged particle microscope instrument inside the inner volume, without the provision of a separate dedicated piece of equipment. In one example, the tool is not movable with respect to the part on which it is mounted. The tool is movable with respect to the sample being processed, by virtue of movement of the sample itself.

The adaptor may be affixed at any appropriate part of the gas injector system. In one example, the gas injector system is fixed with respect to the housing of the instrument. In another example, the gas injector system is moveable with respect to the inner volume.

The charged particle microscope instrument may be a scanning electron microscope, a transmission electron microscope, a focussed ion beam (FIB) instrument, or a combination instrument using a combination of such technologies.

The tool is primarily used for manipulation or probing of samples, for example cutting and repositioning sample portions, or for directly probing (electrically or otherwise) a sample or a portion of it. Any other tool may be provided for providing other functions and capabilities.

DETAILED DESCRIPTION OF THE PREFERRED EMBODIMENTS

Figure 1:
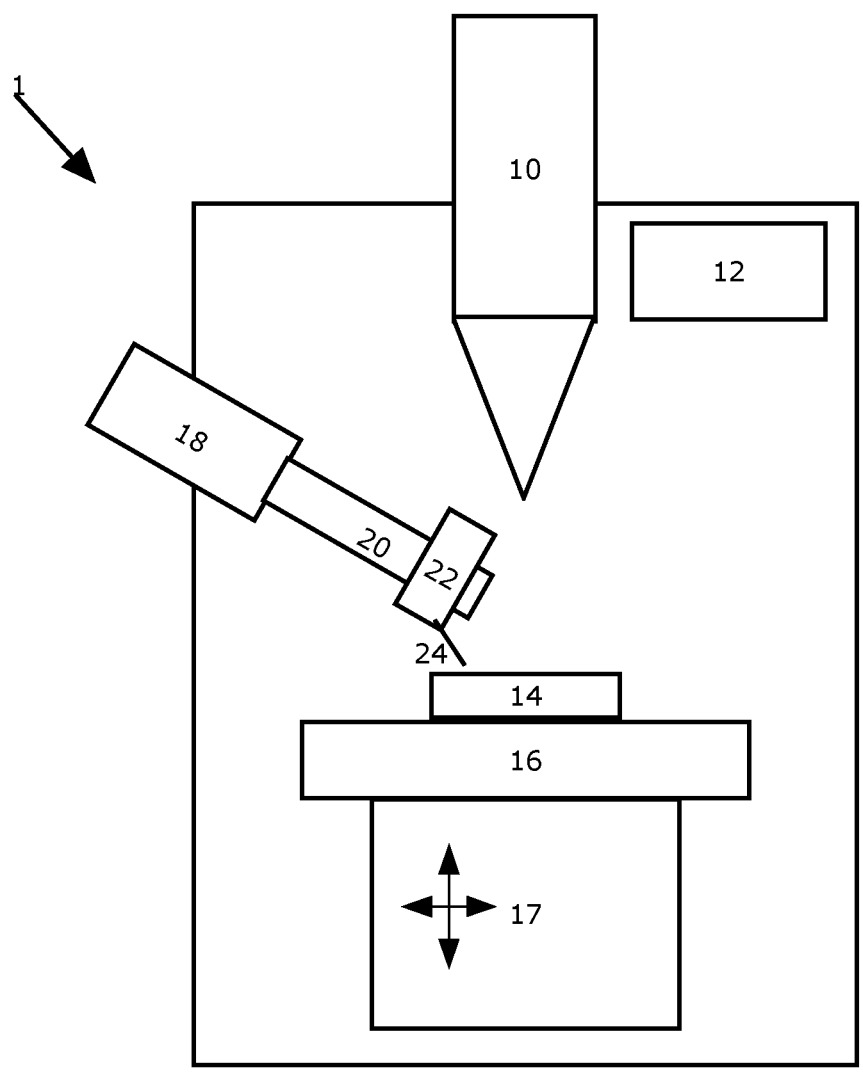
FIG. 1 is a schematic diagram of a charged particle instrument.

FIG. 1 is a simplified schematic illustration of a charged particle instrument 1, such as a microscope instrument. The instrument 1 defines an inner volume 2 in which a sample 14 is located for measurement thereof. In use, the inner volume provides a vacuum chamber in which the sample 14 is able to be observed and manipulated.

The instrument comprises a particle source 10 which is operable to direct a beam of charged particles towards the sample 14. A detector 12 is operable to detect results of the interaction of the charged particle beam and the sample. For example, the sample may reflect, scatter and/or deflect the incident charged particles. The sample may be ablated or caused to emit other charged particles by the incident beam. The detector 12 is operable to detect any such particles or emissions from the sample. The detector 12 is operable to produce detection signals for further processing to determine characteristics of the sample. For example, the shape, construction, or grain orientation of the sample may be determined from the detection signals. In addition, or alternatively, the detection signals may be used to determine material structure, or the elements that make up the sample.

The sample 14 is held by a sample holder 16 which is located on a movable stage 17. The stage 17 is used to place the sample 14 in an appropriate position in the inner volume 2 of the instrument, such that the charged particle beam from the particle source 10 interacts with a chosen part of the sample 14. This interaction is detected by the detector 12 which produces detection signals, as is well known. The stage 17 is operable to move the sample 14 within the inner volume. For example, the stage 17 may be able to move the sample 14 in three dimensions, and is also able to rotate the sample 14 about up to three independent axes. Other combinations of linear and rotational movement are possible, as required by the application of the instrument 1.

In order to provide a suitable environment in which the charged particle beam can interact unimpeded with the sample 14, the inner volume 2 is evacuated to provide a vacuum chamber, in accordance with well-known practice.

Figure 2:
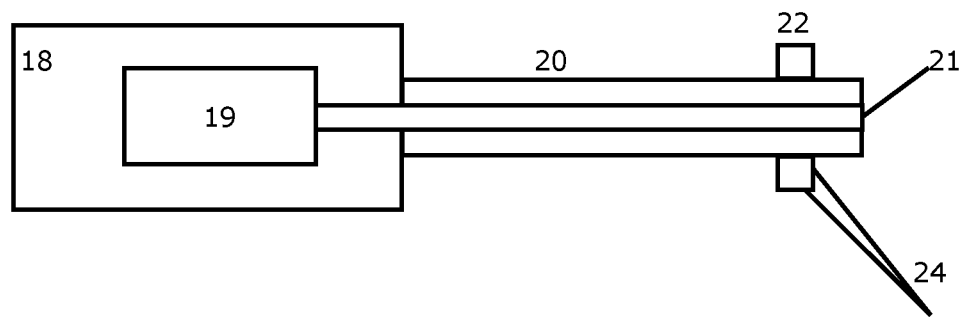
FIG. 2 is a schematic diagram of part of the instrument of FIG. 1.

The instrument 1 is also provided with a gas injection system 18, a simplified example of which is illustrated schematically in FIG. 2. The system 18 comprises a gas source 19, and an injection nozzle 20 which extends into the inner volume 2 of the instrument 1. The injection nozzle 20 defines a gas injection pathway 21 through which gas is injected into the inner volume 2 of the instrument. The gas source 19 and nozzle 20 may be provided in any appropriate configuration.

In one example, the gas injection system 18 is fixed with respect to the inner volume 2 of the instrument 1, and in another example, the gas injection system 18 can move the nozzle 20 in and out of the inner volume 2. The gas injection nozzle 20 may be movable about such a set position within the inner volume 2 in order that the injected gas is received at an appropriate part of the sample 14 in order to aid processing of the sample. Gas is injected into the inner volume 2 adjacent the sample 14 for a variety of reasons. For example, the gas may aid imaging, may provide better etching capabilities, or may enable deposition of a desired material onto the sample 14.

In accordance with the principles of one aspect of the present invention, an adaptor 22 is mounted on the injection nozzle 20. The adaptor is adapted to carry a tool 24 which is used for interaction with the sample 14. In order for the tool 24 to interact with the sample 14, the stage 17 is operable to move the sample 14 with respect to the tool 24. When the gas injection system is extended into the inner volume 2, either by being fixed in such a position, or by being moved into such a position, the tool 24, being affixed to the injection nozzle 20 via the adaptor 22, is located at a fixed position within the inner volume 2 of the instrument 1. In the case where the gas injection nozzle 21 is movable, then the adaptor 22, and tool 24, will be movable with the nozzle 21.

One example of the tool 24 is a manipulator tool or needle. Such a tool is also known as a micro-manipulator or a nano-manipulator. A manipulator tool can, for example, be used to move or otherwise manipulate a portion of the sample 14. An example of such manipulation is illustrated schematically in FIGS. 3 and 4.

Figure 3:
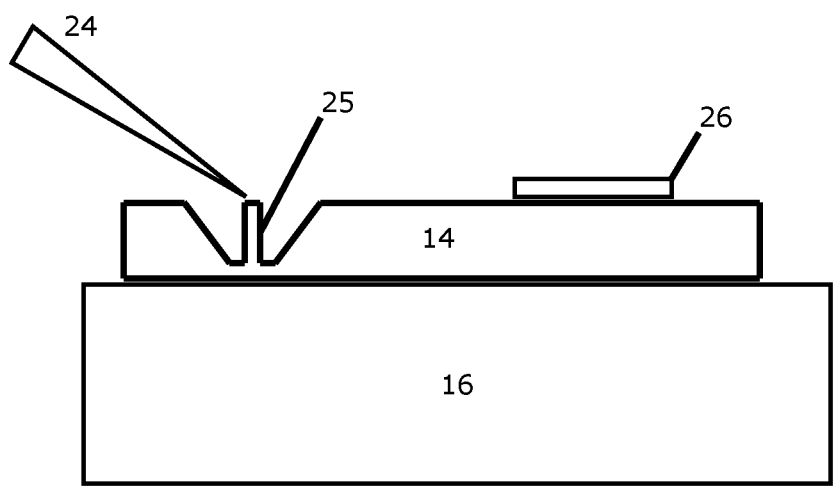
FIGS. 3-4 illustrate use of the instrument of FIGS. 1 and 2.
Figure 4:
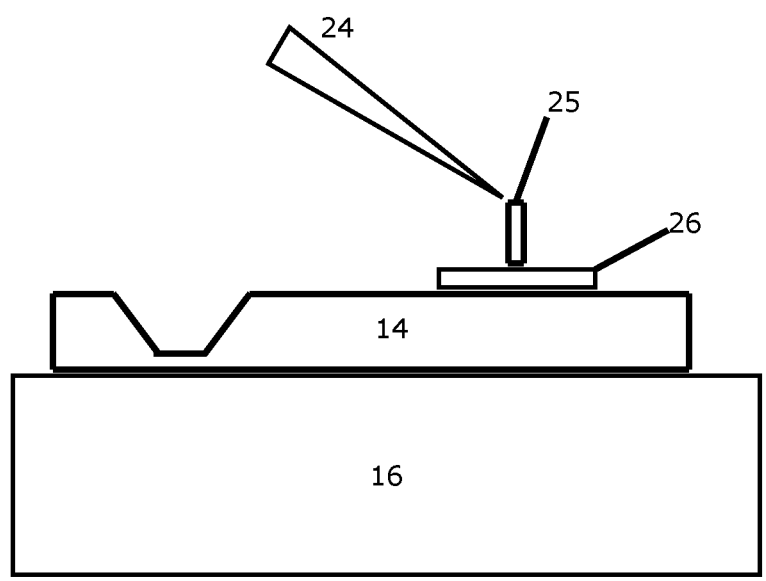

In FIG. 3, the sample 14 is shown having been acted upon by an incident charged particle beam from the source 10, such that a sample portion 25 is available for removal from the sample 14 for transfer to, for example, a sample tray 26. The stage 17 brings the sample 14 into position adjacent the manipulator tool 24 such that the tool 24 engages with the sample portion 25, enabling the sample portion 25 to be moved from the sample 14. As illustrated in FIG. 4, the stage 17 is then moved so that the tool 24, with the sample portion 25 attached thereto, is brought into position adjacent the sample tray 26. The sample portion 25 can then be removed from the tool 24 and placed in the tray 16 for removal to another location for further processing. It will be readily appreciated that the process illustrated in FIGS. 3 and 4 is merely exemplary.

The manipulator tool 24 may be provided by an elongate needle of any appropriate material. For example, the needle may be of a metallic material, such as aluminium or tungsten, or an insulating material, for example a ceramics, plastics or polymer material, or an appropriate combination of the two.

In one particular example, the manipulator tool 24 is provided by a resilient, conductive, non-metallic material, such as a carbon fibre filament. Using a carbon fibre filament as a manipulator tool has several advantages over other materials. A single carbon fibre is flexible such that it is not easily damaged when coming into contact with the sample 14 or other item. This flexibility also reduces the risk of the sample 14 being damaged by engagement with the manipulator tool 24.

The adaptor 22 may be of any appropriate configuration. For example, the adaptor 22 may be provided by a collar which is attached to the injection nozzle 20. The collar may be attached by a threaded attachment or may be attached using an adhesive material. As an alternative, the adaptor may be provided by a clip that attaches releasably to the nozzle 21. Another alternative configuration is provided by a plate or bracket.

The tool 24 may be attached to the collar by an appropriate fitting technique, such as a threaded fitting or adhesive material. In another example, the adaptor 22 may be provided by an adhesive material that attaches the tool 24 directly to the injection nozzle 20.

The exact nature of the tool 24 is not limited to a needle-like manipulator. The tool 24 may be provided by one or more of the following examples:

A gripper or tweezer arrangement for picking up and moving or simply holding or making an electrical, magnetic or thermal contact with part of the sample 14.

A gripper with a drive motor attached for turning or bending part of the sample which can be gripped.

A needle or manipulator with one or more drivable axes of movement for the orientation of sample portions or for modifying the sample surface.

A micro or nano needle for the injection to the sample or piece of sample of a fluid.

A micro or nano needle for the injection of an additional gas onto a target region of the sample or piece of sample.

A device fixture for the application of a force to the sample either passively (sample driven into fixture, or with the fixture driven into the sample).

A device for providing indenting into the sample or part of the sample.

A source of light for directing at the sample surface, for example infra-red light produced from a suitable source.

An LED light source for various applications.

A light detector or light transmission device such as a lens of fibre optic cable either the application of light to the sample surface or the collection of light from the sample surface.

A laser (for example a laser diode) for applying laser light to the sample surface.

An assembly containing 1 or more electrical contacting elements for the purpose of either providing electrical signals to the sample surface or collecting signals from the sample surface.

An electrically biased ring structure (positive or negative bias) for the purpose of accelerating or retarding the speed of signals or products from the sample surface A combination element of electrical contacts an optical elements for the purpose of measuring (or providing) electrical signals in parallel with optical signals (for example powering a local device and collecting any emitted light signals produced (or measuring changes in the behaviour of a device by providing it with an optical energy.

A heating or cooling element that may be brought in contact or close proximity to the surface of a sample or piece of sample.

A physical structure for concentrating the flow of an injected gas in a specific way, or for restricting or modifying the normal gas dissipation.

A system for delivering electrons to the sample surface for various applications (such as charge neutralisation or reduction or injection).

An x-ray collector, with or without an material component which may produce x-rays when excited by an incident charged particle beam A cryogenic probe.

A mini/micro collection screen, with or without an imaging camera.

An electron detector such as an MCP, or an electron multiplier (for the collection of electrons or ions from the sample at a local location) the detector or multiplier may be above, to the side or underneath the sample or part of sample concerned.

A magnet or magnetic probe for various applications.

An electromagnet or probe for various applications.

Attachments for drilling or cutting parts of a sample.

It will, therefore, be appreciated that embodiments of the present invention provide an apparatus that allows samples to be manipulated within a charged particle instrument, with lower complexity and cost compared to existing solutions.

The invention claimed is:

1. An adaptor for attachment to a nozzle of a gas injection system provided in an inner volume of a charged particle instrument, the adaptor having a first portion adapted for releasable attachment to the nozzle of the gas injection system of the charged particle instrument, which nozzle is located within an inner volume of such an instrument and comprises a body defining a gas injection pathway, and is operable to provide a gas injection function for the charge particle instrument concerned; and a second portion configured to receive a tool configured for interaction with a sample located in the inner volume of such an instrument, wherein the adaptor provides the tool within the inner volume in addition to the nozzle of such a gas injection system but outside of the gas injection pathway without the provision of an additional apparatus within the inner volume, wherein the tool is configured to remove a portion of the sample.

2. A sample interaction apparatus for a charged particle instrument which defines an inner volume therein, the apparatus comprising: an adaptor having a first portion adapted for releasable attachment to a nozzle of a gas injection system of the charged particle instrument, which nozzle is located within the inner volume of such an instrument and comprises a body defining a gas injection pathway, and is operable to provide a gas injection function for the charge particle instrument concerned; and a tool attached to a second portion of the adaptor, the tool being configured for interaction with a sample located in the inner volume of such an instrument, wherein the adaptor provides the tool within the inner volume in addition to the nozzle of such a gas injection system but outside of the gas injection pathway without the provision of an additional apparatus within the inner volume, wherein the tool is a manipulation needle, and wherein the tool is of a conductive, non-metallic material provided by a single carbon fibre.

3. An apparatus as claimed in claim 2, wherein the tool is adapted to be releasably attached to the adaptor.

4. An apparatus as claimed in claim 1, wherein the tool is further configured to manipulate a portion of the sample.

5. An adaptor for attachment to a nozzle of a gas injection system provided in an inner volume of a charged particle instrument, the adaptor having a first portion adapted for releasable attachment to the nozzle of the gas injection system of the charged particle instrument, which nozzle is located within an inner volume of such an instrument and comprises a body defining a gas injection pathway, and is operable to provide a gas injection function for the charge particle instrument concerned; and a second portion configured to receive a tool configured for interaction with a sample located in the inner volume of such an instrument, wherein the adaptor provides the tool within the inner volume in addition to the nozzle of such a gas injection system but outside of the gas injection pathway without the provision of an additional apparatus within the inner volume, wherein the tool is configured to move only a portion of the sample relative to the sample.

6. An apparatus as claimed in claim 5, wherein the tool is a manipulation needle.

7. An apparatus as claimed in claim 6, wherein the tool is of a conductive, non-metallic material.

8. An apparatus as claimed in claim 1, wherein the tool is a manipulation needle.

9. An apparatus as claimed in claim 8, wherein the tool is of a conductive, non-metallic material.

* * * * *